(12) United States Patent
Enomoto et al.

(10) Patent No.: US 11,043,254 B2
(45) Date of Patent: Jun. 22, 2021

(54) SEMICONDUCTOR DEVICE HAVING CAM THAT STORES ADDRESS SIGNALS

(71) Applicant: MICRON TECHNOLOGY, INC., Boise, ID (US)

(72) Inventors: Honoka Enomoto, Chofu (JP); Masaru Morohashi, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/358,587

(22) Filed: Mar. 19, 2019

(65) Prior Publication Data

US 2020/0302994 A1 Sep. 24, 2020

(51) Int. Cl.
*G11C 11/408* (2006.01)
*G11C 11/406* (2006.01)
*G06F 7/58* (2006.01)

(52) U.S. Cl.
CPC ........ *G11C 11/40603* (2013.01); *G06F 7/584* (2013.01); *G11C 11/408* (2013.01)

(58) Field of Classification Search
CPC .... G11C 8/00; G11C 8/04; G11C 8/06; G11C 11/4063; G11C 11/408
See application file for complete search history.

(56) References Cited

U.S. PATENT DOCUMENTS

| | | | |
|---|---|---|---|
| 5,299,159 A | 3/1994 | Balistreri et al. | |
| 5,422,850 A | 6/1995 | Sukegawa et al. | |
| 5,699,297 A | 12/1997 | Yamazaki et al. | |
| 5,768,196 A | 6/1998 | Bloker et al. | |
| 5,933,377 A | 8/1999 | Hidaka | |
| 5,943,283 A | 8/1999 | Wong et al. | |
| 5,970,507 A | 10/1999 | Kato et al. | |
| 5,999,471 A | 12/1999 | Choi | |
| 6,002,629 A | 12/1999 | Kim et al. | |
| 6,011,734 A | 1/2000 | Pappert | |
| 6,061,290 A | 5/2000 | Shirley | |
| 6,212,118 B1 | 4/2001 | Fujita | |
| 6,310,806 B1 | 10/2001 | Higashi et al. | |
| 6,317,381 B1 | 11/2001 | Gans et al. | |

(Continued)

FOREIGN PATENT DOCUMENTS

| | | |
|---|---|---|
| CN | 1195173 A | 10/1998 |
| CN | 101038785 A | 9/2007 |

(Continued)

OTHER PUBLICATIONS

Application No. PCT/US20/23689, titled "Semiconductor Device Having Cam That Stores Address Signals", dated Mar. 19, 2020.

(Continued)

*Primary Examiner* — Alfredo Bermudez Lozada
(74) *Attorney, Agent, or Firm* — Dorsey & Whitney LLP

(57) ABSTRACT

An apparatus may include multiple address registers each storing an address signal and multiple counter circuits each storing a count value corresponding to an associated one of the address registers. The apparatus may include a first circuit cyclically selecting one of the address registers in response to a first signal, a second circuit selecting one of the address registers based on the count value of each of the counter circuits, and a third circuit activating a second signal when the first and second circuits select the same one of the address registers.

19 Claims, 9 Drawing Sheets

(56) References Cited

U.S. PATENT DOCUMENTS

| | | |
|---|---|---|
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,770,127 B2 | 9/2020 | Shore et al. |
| 2001/0008498 A1 | 7/2001 | Ooishi |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0008544 A1 | 1/2004 | Shinozaki et al. |
| 2004/0022093 A1 | 2/2004 | Lee |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0218431 A1 | 11/2004 | Chung et al. |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182663 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0216614 A1 | 9/2011 | Hosoe |

(56) References Cited

U.S. PATENT DOCUMENTS

| | | |
|---|---|---|
| 2011/0225355 A1 | 9/2011 | Kajigaya |
| 2011/0286271 A1 | 11/2011 | Chen |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0173971 A1 | 7/2013 | Zimmerman |
| 2013/0254475 A1 | 9/2013 | Perego et al. |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0355332 A1 | 12/2014 | Youn et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1* | 9/2015 | Igarashi ............... G11C 11/408 711/106 |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078911 A1* | 3/2016 | Fujiwara ............... G11C 7/109 365/189.2 |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0161341 A1 | 5/2019 | Howe |
| 2019/0196730 A1 | 6/2019 | Imran |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |

(56) References Cited

U.S. PATENT DOCUMENTS

| | | |
|---|---|---|
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0349995 A1 | 11/2020 | Shore et al. |
| 2021/0026732 A1 | 1/2021 | Park et al. |
| 2021/0065755 A1 | 3/2021 | Kim et al. |
| 2021/0065764 A1 | 3/2021 | Cheng et al. |

FOREIGN PATENT DOCUMENTS

| | | |
|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 A | 12/2011 |
| JP | 4911510 B2 | 1/2012 |
| JP | 2013-004158 A | 1/2013 |
| KR | 1020180064940 A | 6/2018 |
| KR | 1020180085184 A | 7/2018 |
| WO | 2019222960 A1 | 11/2019 |
| WO | 2020010010 A1 | 1/2020 |

OTHER PUBLICATIONS

U.S. Appl. No. 16/797,658, titles "Apparatuses and Methods for Controlling Refresh Operations", filed Feb. 21, 2020.
U.S. Appl. No. 16/513,400 titled "Apparatuses and Methods for Tracking Row Accesses" filed Jul. 16, 2019.
U.S. Appl. No. 16/805,197, titled "Apparatuses and Methods for Calculating Row Hammer Refresh Addresses in a Semiconductor Device", dated Feb. 28, 2020.
Unpublished Application for Application No. PCT/US20/32684, titled "Apparatuses, Systems, and Methods for a Content Addressable Memory Cell", dated May 13, 2020.
U.S. Appl. No. 16/546,152 titled "Apparatuses and Methods for Analog Row Access Tracking" filed Aug. 20, 2019.
U.S. Appl. No. 16/548,027 titled "Apparatuses, Systems, and Methods for Analog Row Access Rate Determination" filed Aug. 22, 2019.
U.S. Appl. No. 16/549,942 titled "Apparatuses and Methods for Lossy Row Access Counting" filed Aug. 23, 2019.
U.S. Appl. No. 16/425,525 titled "Apparatuses and Methods for Tracking All Row Accesses" filed May 29, 2019.
U.S. Appl. No. 16/427,105 titled "Apparatuses and Methods for Priority Targeted Refresh Operations" filed May 30, 2019.
U.S. Appl. No. 16/427,140 titled "Apparatuses and Methods for Tracking Row Access Counts Between Multiple Register Stacks" filed May 30, 2019.
U.S. Appl. No. 16/437,811 titled "Apparatuses, Systems, and Methods for Determining Extremum Numerical Values" filed Jun. 11, 2019.
U.S. Appl. No. 16/012,679, titled "Apparatuses and Methods for Multiple Row Hammer Refresh Address Sequences", filed Jun. 19, 2018.
U.S. Appl. No. 16/268,818, titled "Apparatuses and Methods for Managing Row Access Counts", filed Feb. 6, 2019.
U.S. Appl. No. 16/411,573 titled "Apparatuses, Systems, and Methods for a Content Addressable Memory Cell" filed May 14, 2019.
U.S. Appl. No. 16/427,330 titled "Apparatuses and Methods for Storing Victim Row Data" filed May 30, 2019.
U.S. Appl. No. 16/428,625 titled "Apparatuses and Methods for Tracking Victim Rows" filed May 31, 2019.
U.S. Appl. No. 16/459,520 titled "Apparatuses and Methods for Monitoring Word Line Accesses", filed Jul. 1, 2019, pp. all.
Kim, et al., "Flipping Bits in Memory Without Accessing Them: An Experimental Study of DRAM Disturbance Errors", IEEE, Jun. 2014, 12 pgs.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/232,837, titled "Apparatuses and Methods for Distributed Targeted Refresh Operations", filed Dec. 26, 2018; pp. all.
U.S. Appl. No. 16/818,989, titled "Semiconductor Device Performing Row Hammer Refresh Operation", dated Mar. 13, 2020, pp. all.
U.S. Appl. No. 16/286,187 titled "Apparatuses and Methods for Memory Mat Refresh Sequencing" filed Feb. 26, 2019; pp. all.
U.S. Appl. No. 16/084,119, titled "Apparatuses and Methods for Pure-Time, Self Adopt Sampling for Row Hammer Refresh Sampling", filed Sep. 11, 2018; pp. all.
U.S. Appl. No. 16/886,284 titled "Apparatuses and Methods for Access Based Refresh Timing" filed May 28, 2020, pp. all.
U.S. Appl. No. 16/886,284 titled "Apparatuses and Methods for Access Based Refresh Timing", dated May 28, 2020, pp. all.
U.S. Appl. No. 16/375,716 titled "Apparatuses and Methods for Staggered Timing of Targeted Refresh Operations" filed Apr. 4, 2019; pp. all.
U.S. Appl. No. 16/788,657, titled "Semiconductor Device Performing Row Hammer Refresh Operation", dated Feb. 12, 2020, pp. all.
U.S. Appl. No. 15/881,256 entitled 'Apparatuses and Methods for Detecting a Row Hammer Attack With a Bandpass Filter' filed Jan. 26, 2018, pp. all.
U.S. Appl. No. 16/537,981 titled "Apparatuses and Methods for Controlling Targeted Refresh Rates" filed Aug. 12, 2019, pp. all.
U.S. Appl. No. 16/655,110 titled "Apparatuses and Methods for Dynamic Targeted Refresh Steals" filed Oct. 16, 2019, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/176,932, titled "Apparatuses and Methods for Access Based Refresh Timing", filed Oct. 31, 2018, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/431,641 titled "Apparatuses and Methods for Controlling Steal Rates" filed Jun. 4, 2019, pp. all.
U.S. Appl. No. 16/549,411 titled "Apparatuses and Methods for Dynamic Refresh Allocation" filed Aug. 23, 2019, pp. all.
U.S. Appl. No. 16/682,606, titled "Apparatuses and Methods for Distributing Row Hammer Refresh Events Across a Memory Device", filed Nov. 13, 2019, pp. all.

(56) References Cited

OTHER PUBLICATIONS

International Search Report/Written Opinion dated Jul. 8, 2020 for PCT Application No. PCT/US2020/023689, 12 pgs.
U.S. Appl. No. 15/884,192 entitled 'Semiconductor Device Performing Row Hammer Refresh Operation' filed Jan. 30, 2018, pp. all.
U.S. Appl. No. 16/936,297 titled "Apparatuses and Methods for Managing Row Access Counts" filed Jul. 22, 2020, pp. all.
Thomas, et al., "Voltage Source Based Voltage-to-Time Converter", IEEE, 2020, p. All.
U.S. Appl. No. 17/154,945 titled "Apparatuses, Systems, and Methods for a Content Addressable Memory Cell" filed Jan. 21, 2021, pp. all.
U.S. Appl. No. 17/168,036 titled "Apparatuses and Methods for Analog Row Access Tracking" filed Feb. 4, 2021, pp. all.
U.S. Appl. No. 17/102,266, titled "Apparatuses and Methods for Tracking Word Line Accesses", dated Nov. 23, 2020, pp. all.
U.S. Appl. No. 17/201,941 titled "Apparatuses and Methods for Sketch Circuits for Refresh Binning" filed Mar. 15, 2021, pp. all.
U.S. Appl. No. 17/301,533 titled "Semiconductor Device Having CAM that Stores Address Signals" filed Apr. 6, 2021, pp. all.

\* cited by examiner

SEMICONDUCTOR DEVICE HAVING CAM THAT STORES ADDRESS SIGNALS

BACKGROUND

In a semiconductor device such as a DRAM (Dynamic Random Access Memory), concentration of access on the same word line may cause deterioration of information retention characteristics of memory cells connected to an adjacent word line. Therefore, in some cases, a refresh operation of the memory cells is performed in addition to a normal refresh operation to prevent information of the memory cells connected to the adjacent word line from being lost. This additional refresh operation is called "row hammer refreshing operation".

The row hammer refresh operation is performed on word lines adjacent to word lines at which accesses are concentrated. In order to realize this operation, addresses of a plurality of word lines at which accesses are concentrated are stored in an address storing circuit and one of the addresses is read from the address storing circuit at a time of the row hammer refresh operation. However, when the row hammer refresh operation is to be performed, which one of the addresses stored in the address storing circuit is to be read is the issue to be handled.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
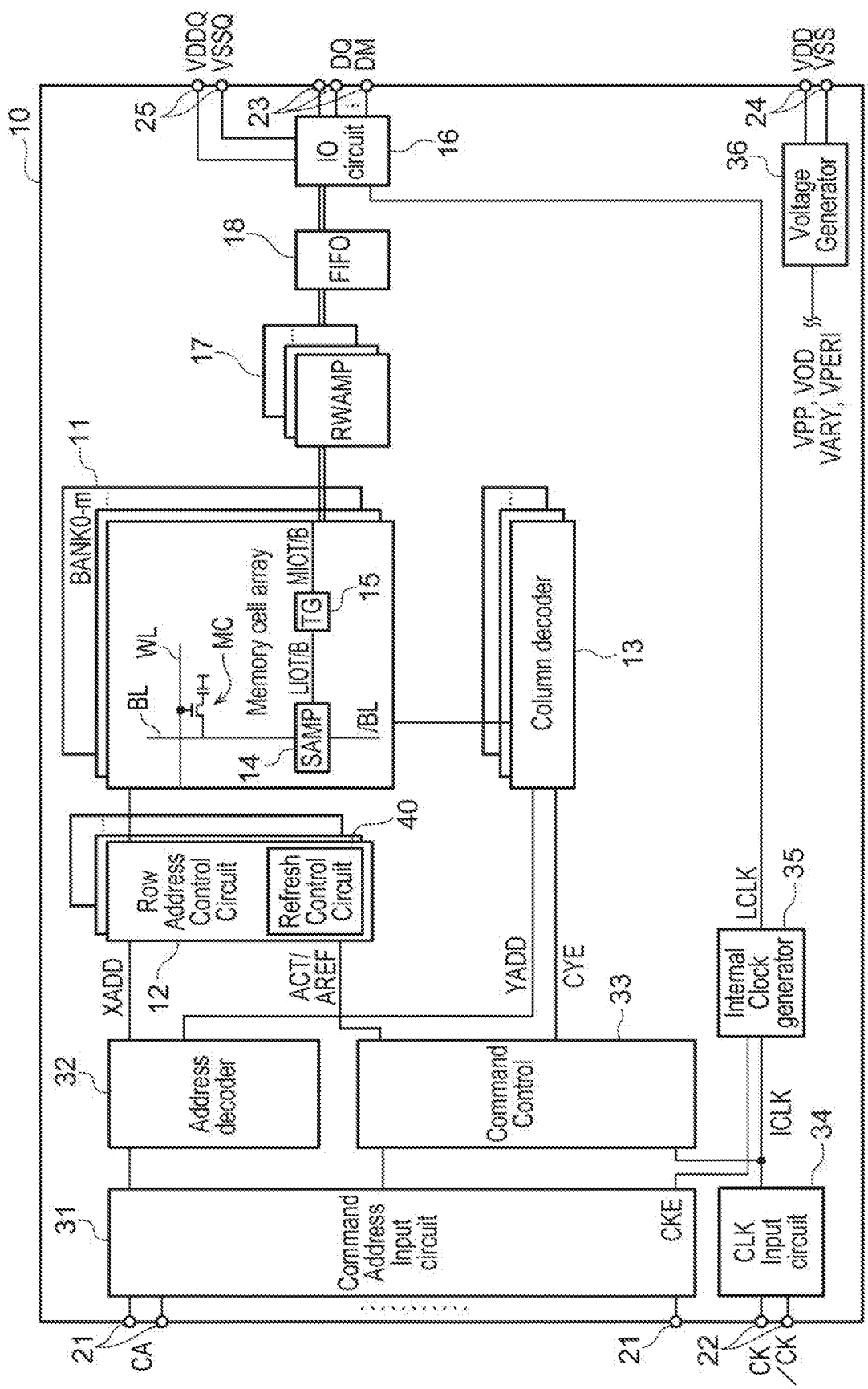
FIG. 1 is a block diagram of a semiconductor device according to an embodiment of the present disclosure.

FIG. 1 is a block diagram of a semiconductor device 10 according to an embodiment of the present disclosure. The semiconductor device 10 may be a DDR4 SDRAM incorporated in a single semiconductor chip, for example. The semiconductor device 10 may be mounted on an external substrate, for example, a memory module substrate or a mother board. As shown in FIG. 1, the semiconductor device to includes a memory cell array 11. The memory cell array 11 includes a plurality of word lines WL, a plurality of bit lines BL, and a plurality of memory cells MC arranged at intersections of the word lines WL and the bit lines BL. Selection of a word line WL is performed by a row address control circuit 12, and selection of a bit line BL is performed by a column decoder 13. A sense amplifier 14 is connected to a corresponding bit line BL and a pair of local I/O lines LIOT/B. The pair of local I/O lines LIOT/B is connected to a pair of main I/O lines MIOT/B via a transfer gate 15 functioning as a switch. The memory cell array 11 is divided into (m+1) memory banks including memory banks BANK0 to BANKm.

A plurality of external terminals included in the semiconductor device 10 include command address terminals 21, clock terminals 22, data terminals 23, and power-supply terminals 24 and 25. The data terminals 23 are connected to an I/O circuit 16.

A command address signal CA is supplied to the command address terminals 21. One of the command address signals CA supplied to the command address terminals 21, which relates to an address, is transferred to an address decoder 32 via a command address input circuit 31. Another one that relates to a command is transferred to a command control circuit 33 via the command address input circuit 31. The address decoder 32 decodes an address signal and generates a row address XADD and a column address YADD. The mw address XADD is supplied to the row address control circuit 12, and the column address YADD is supplied to the column decoder 13. Further, a command address signal CA that functions as a clock enable signal CKE is supplied to an internal clock generator 35.

Complementary external clock signals CK and /CK are supplied to the clock terminals 22. The complementary external clock signals CK and /CK are input to a clock input circuit 34. The clock input circuit 34 generates an internal clock signal ICLK based on the complementary external clock signals CK and /CK. The internal clock signal ICLK is supplied to at least the command control circuit 33 and the internal clock generator 35. The internal clock generator 35 is activated by the clock enable signal CKE, for example, and generates an internal clock signal LCLK based on the internal clock signal ICLK. The internal clock signal LCLK is supplied to the I/O circuit 16. The internal clock signal LCLK is used as a timing signal that defines a timing at which read data DQ is output from the data terminal 23 at the time of a read operation. In a write operation, write data is input to the data terminal 23 from outside. In the write operation, a data mask signal DM may be input to the data terminal 23 from outside.

Power-supply potentials VDD and VSS are supplied to the power-supply terminals 24. These power-supply potentials VDD and VSS are supplied to a voltage generator 36. The voltage generator 36 generates various internal potentials VPP, VOD, VARY, and VPERI, for example, based on the power-supply potentials VDD and VSS. The internal potential VPP is used mainly in the row address control circuit 12. The internal potentials VOD and VARY are used mainly in the sense amplifier 14 included in the memory cell array 11. The internal potential VPERI is used in many other circuit blocks.

Power-supply potentials VDDQ and VSSQ are supplied to the I/O circuit 16 from the power-supply terminals 25.

Although the power-supply potentials VDDQ and VSSQ may be the same potentials as the power-supply potentials VDD and VSS supplied to the power supply terminals 24, respectively, the dedicated power-supply potentials VDDQ and VSSQ are assigned to the I/O circuit 16 in order to prevent propagation of power-supply noise generated in the I/O circuit 16 to another circuit block.

The command control circuit 33 activates an active signal ACT when an active command is issued, and activates a refresh signal AREF when a refresh command is issued. The active signal ACT and the refresh signal AREF are both supplied to the row address control circuit 12. The row address control circuit 12 includes a refresh control circuit 40. The refresh control circuit 40 controls a refresh operation for the memory cell array 11 based on the row address XADD, the active signal ACT, and the refresh signal AREF. The refresh control circuit 40 will be described in detail later.

When a read command is issued firm outside, following the active command, the command control circuit 33 activates a column selection signal CYE. The column selection signal CYE is supplied to the column decoder 13. In response to this signal, read data is read out from the memory cell array 11. The read data read from the memory cell array 11 is transferred to the (O circuit 16 via a read-write amplifier 17 and an FIFO circuit 18, and is output to outside via the data terminals 23.

Figure 2:
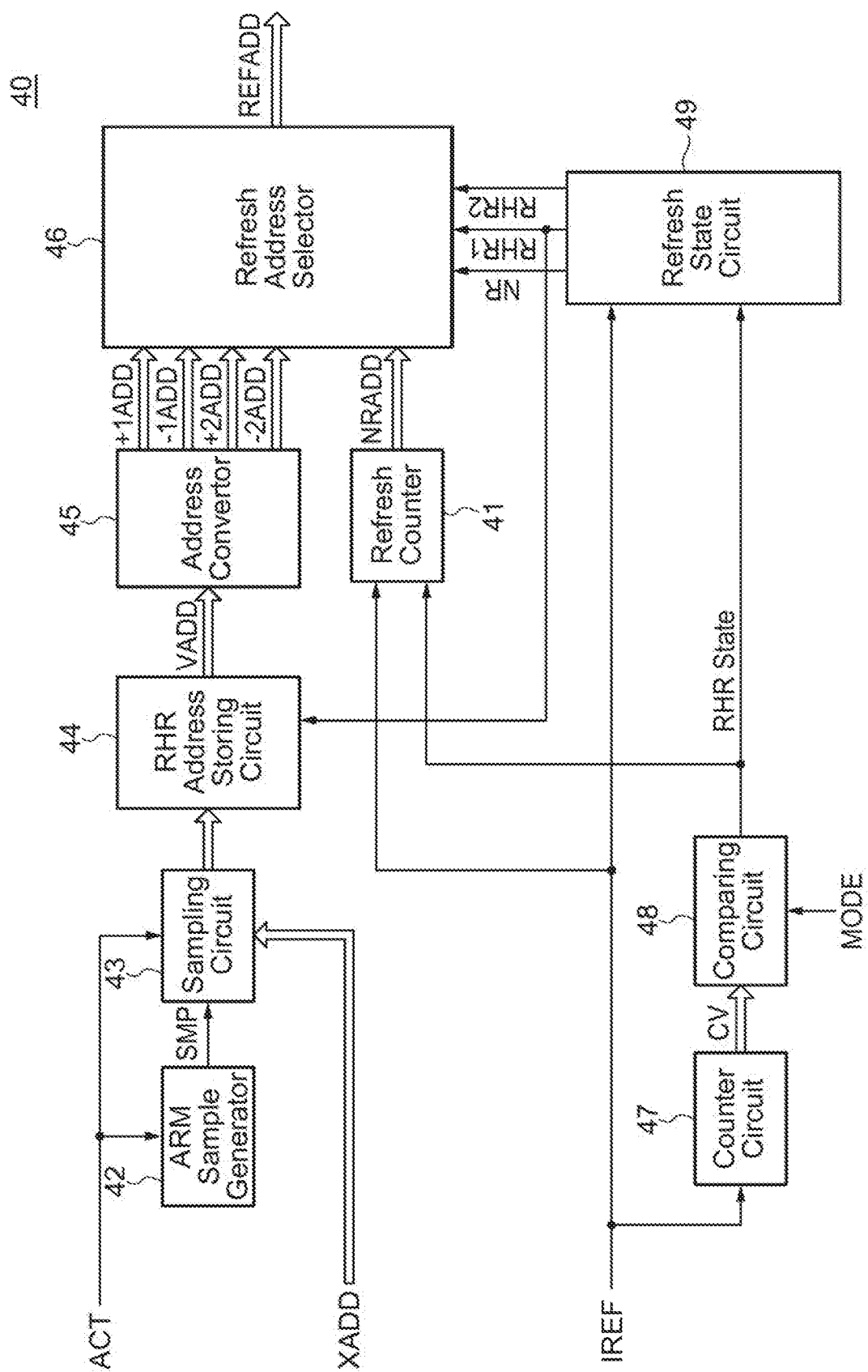
FIG. 2 is a block diagram for explaining a configuration of a refresh control circuit.

FIG. 2 is a block diagram for explaining a configuration of the refresh control circuit 40.

As shown in FIG. 2, the refresh control circuit 40 includes a refresh counter 41, an ARM sample generator 42, a sampling circuit 43, a row hammer address storing circuit 44, an address convertor 45, and a refresh address selector 46. The refresh counter 41 generates a normal refresh address NRADD. The normal refresh address NRADD is incremented or decremented in response to an internal refresh signal IREF. The internal refresh signal IREF can be a signal activated plural times on the basis of the refresh signal AREF. The sampling circuit 43 samples the row address XADD at a timing when a sampling signal SMP generated by the ARM sample generator 42 is activated, and supplies the sampled row address XADD to the row hammer address storing circuit 44. The ARM sample generator 42 may activate the sampling signal SMP at a timing when the active signal ACT is activated for a predetermined number of times. Accordingly, an address VADD of a word line WL at which accesses are concentrated is supplied to the row hammer address storing circuit 44. As described later, the row hammer address storing circuit 44 stores a plurality of row addresses VADD. The row addresses VADD stored in the row hammer address storing circuit 44 are supplied to the address convertor 45. The address convertor 45 converts the row addresses VADD to generate row hammer refresh addresses +1ADD, −1ADD, +2ADD, and −2ADD.

Figure 3:
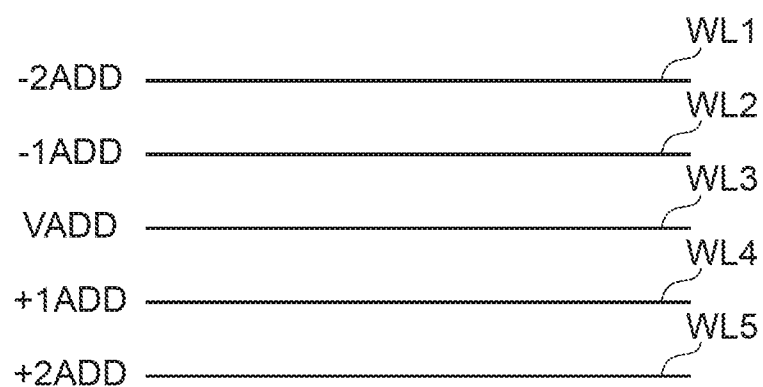
FIG. 3 is a schematic diagram for explaining a relation between an address of a word line at which accesses are concentrated and addresses of word lines on which a row hammer refresh operation is to be performed.

The row hammer refresh addresses +1ADD and −1ADD are addresses of word lines WL adjacent to the word line WL having the row address VADD assigned thereto on the both sides. The row hammer refresh addresses +2ADD and −2ADD are addresses of word lines WL two lines away from the word line WL having the row address VADD assigned thereto on the both sides. For example, when word lines WL1 to WL5 are arranged in this order as shown in FIG. 3 and accesses are concentrated at the word line WL3, the row address VADD corresponds to the word line WL3, the row hammer refresh addresses −1ADD and +1ADD correspond to the word lines WL2 and WL4, respectively, and the row hammer refresh addresses −2ADD and +2ADD correspond to the word lines WL1 and WL5, respectively. In the word lines WL4, WL2, WL5, and WL1 to which the row hammer refresh addresses +1ADD, −1ADD, +2ADD, and −2ADD are respectively assigned, there is a possibility that the information storing performance of associated memory cells MC is decreased because accesses are concentrated at the word line WL3 adjacent thereto or two lines away therefrom. The normal refresh address NRADD and the row hammer refresh addresses +1ADD, −1ADD, +2ADD, and −2ADD are supplied to the refresh address selector 46.

The refresh control circuit 40 further includes a counter circuit 47, a comparing circuit 48, and a refresh state circuit 49. The counter circuit 47 increments or decrements a count value CV in response to the internal refresh signal IREF. The comparing circuit 48 receives the count value CV and activates a refresh state signal RHR State each time the count value CV reaches a predetermined value. The predetermined value can be changed with a mode signal MODE. Therefore, it suffices to set the predetermined value to a small value with the mode signal MODE when the frequency of the row hammer refresh operations is to be increased, and set the predetermined value to a large value with the mode signal MODE when the frequency of the row hammer refresh operations is to be decreased. The refresh counter 41 may temporarily stop an update operation of the normal refresh address NRADD when the refresh state signal RHR State is activated.

The refresh state signal RHR State is supplied to the refresh state circuit 49. The refresh state circuit 49 generates refresh selection signals NR, RHR1, and RHR2 on the basis of the internal refresh signal IREF and the refresh state signal RHR State.

The refresh state circuit 49 activates the refresh selection signal NR when the refresh state signal RHR State is in an inactive state. The refresh selection signal NR is a signal activated when the normal refresh operation is to be performed. In a case where the refresh selection signal NR is activated, the refresh address selector 46 selects the normal refresh address NRADD output from the refresh counter 41 and outputs the normal refresh address NRADD as a refresh address REFADD. When the refresh state signal RHR State is in an active state, the refresh state circuit 49 activates the refresh selection signal RHR1 or RHR2. The refresh selection signal RHR1 is a signal activated when the row hammer refresh operation is to be performed on the word lines WL2 and WL4 adjacent to the word line WL3 at which accesses are concentrated. In a case where the refresh selection signal RHR1 is activated, the refresh address selector 46 selects the row hammer refresh addresses +1ADD and −1ADD output from the address convertor 45 and outputs the row hammer refresh addresses +1ADD and −1ADD as the refresh addresses REFADD. The refresh selection signal RHR1 is supplied also to the row hammer address storing circuit 44. The refresh selection signal RHR2 is a signal activated when the row hammer refresh operation is to be performed on the word lines WL1 and WL5 two lines away from the word lines WL3 at which accesses are concentrated. In a case where the refresh selection signal RHR2 is activated, the refresh address selector 46 selects the row hammer refresh addresses +2ADD and −2ADD output from the address convertor 45 and outputs the row hammer refresh addresses +2ADD and −2ADD as the refresh addresses REFADD.

Figure 4:
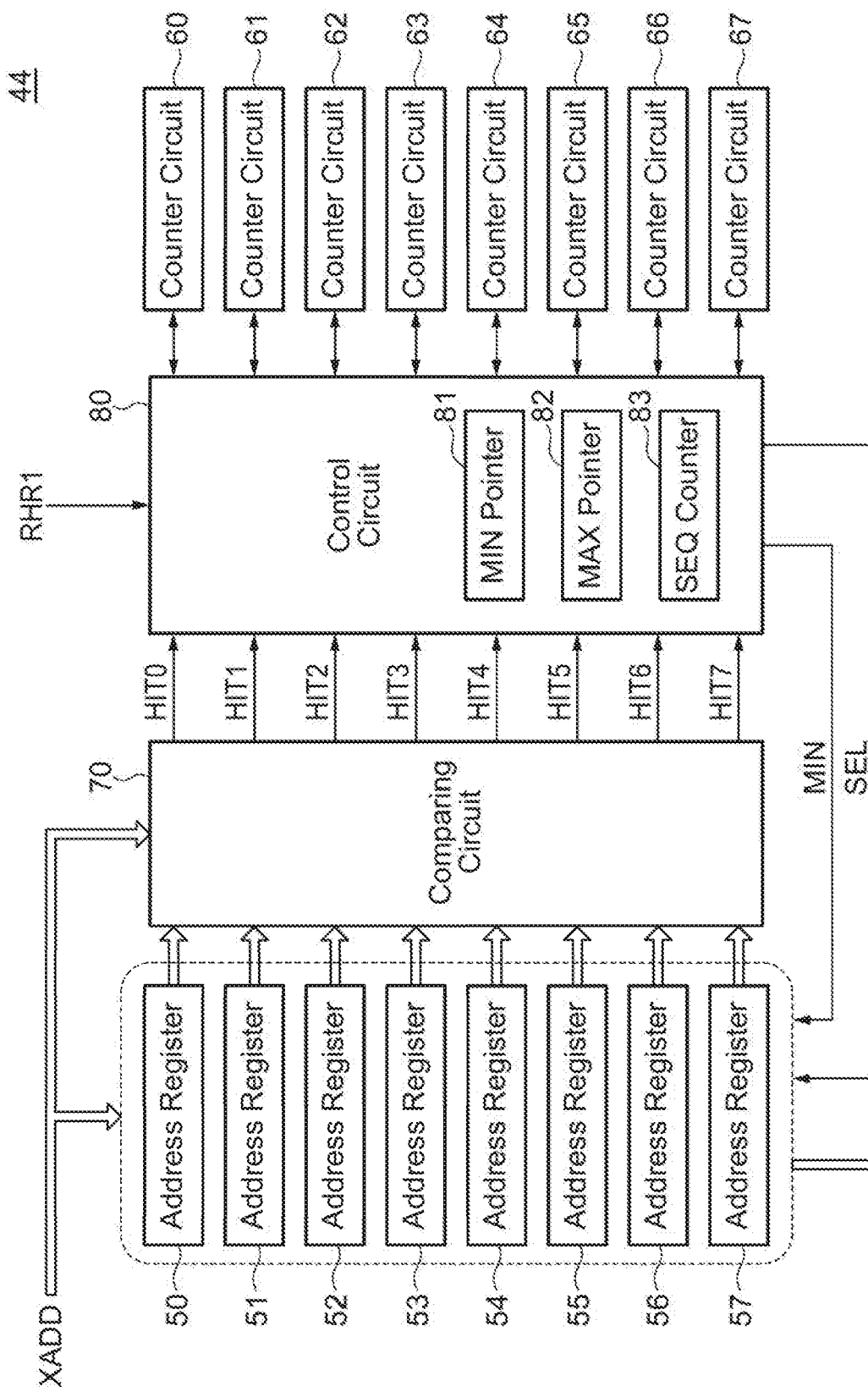
FIG. 4 is a block diagram for explaining a configuration of a row hammer address storing circuit.

FIG. 4 is a block diagram for explaining a configuration of the row hammer address storing circuit 44.

As shown in FIG. 4, the row hammer address storing circuit 44 includes a plurality of address registers 50 to 57, a plurality of counter circuits 60 to 67, a comparing circuit 70, and a control circuit 80. While eight address registers 50 to 57 are illustrated in an example shown in FIG. 4, the number of address registers included in the row hammer address storing circuit 44 is not limited thereto. The row addresses XADD sampled by the sampling circuit 43 are stored in the address registers 50 to 57, respectively. The counter circuits 60 to 67 correspond to the address registers 50 to 57, respectively.

The comparing circuit 70 compares the input row address XADD with each of the row addresses XADD stored in the address registers 50 to 57. When the input row address XADD matches with any of the row addresses XADD stored in the address registers 50 to 57, the comparing circuit 70 activates a corresponding one of hit signals HIT0 to HIT7. When any of the hit signals HIT0 to HIT7 is activated, the control circuit 80 increments the count value of a corresponding one of the counter circuits 60 to 67. Therefore, the count values of the counter circuits 60 to 67 indicate the numbers of times when the row addresses XADD stored in the address registers 50 to 57 are sampled by the sampling circuit 43, respectively. The control circuit 80 includes a minimum pointer 81 that indicates one of the counter circuits 60 to 67 having a smallest count value, and a maximum pointer 82 that indicates one of the counter circuits 60 to 67 having a greatest count value.

On the other hand, when none of the hit signals HIT0 to HIT7 is activated, that is, when the input row address XADD does not match with any of the row addresses XADD respectively stored in the address registers 50 to 57, the control circuit 80 resets one of the counter circuits 60 to 67 indicated by the minimum pointer 81 to an initial value and supplies a point number MIN to the address registers 50 to 57. Accordingly, the input row address XADD is overwritten in one of the address registers 50 to 57 indicated by the point value MIN. In this way, when the input row address XADD does not match with any of the row addresses XADD respectively stored in the address registers 50 to 57, the value of one of the address registers 50 to 57 storing the row address XADD that is least frequently accessed is overwritten.

One of the row addresses XADD stored in the address registers 50 to 57 is output as the row address VADD in response to the refresh selection signal RHR1. The control circuit 80 further includes a sequential counter 83. When the refresh selection signal RHR1 is activated, either a point value MAX indicated by the maximum pointer 82 or a point value SEQ indicated by the sequential counter 83 is selected. One of the address registers 50 to 57 is selected by a selected point value SEL and the row address XADD stored in the selected one of the address registers 50 to 57 is output as the row address VADD. The value of one of the counter circuits 60 to 67 corresponding to the selected point value SEL is reset to an initial value.

Figure 5:
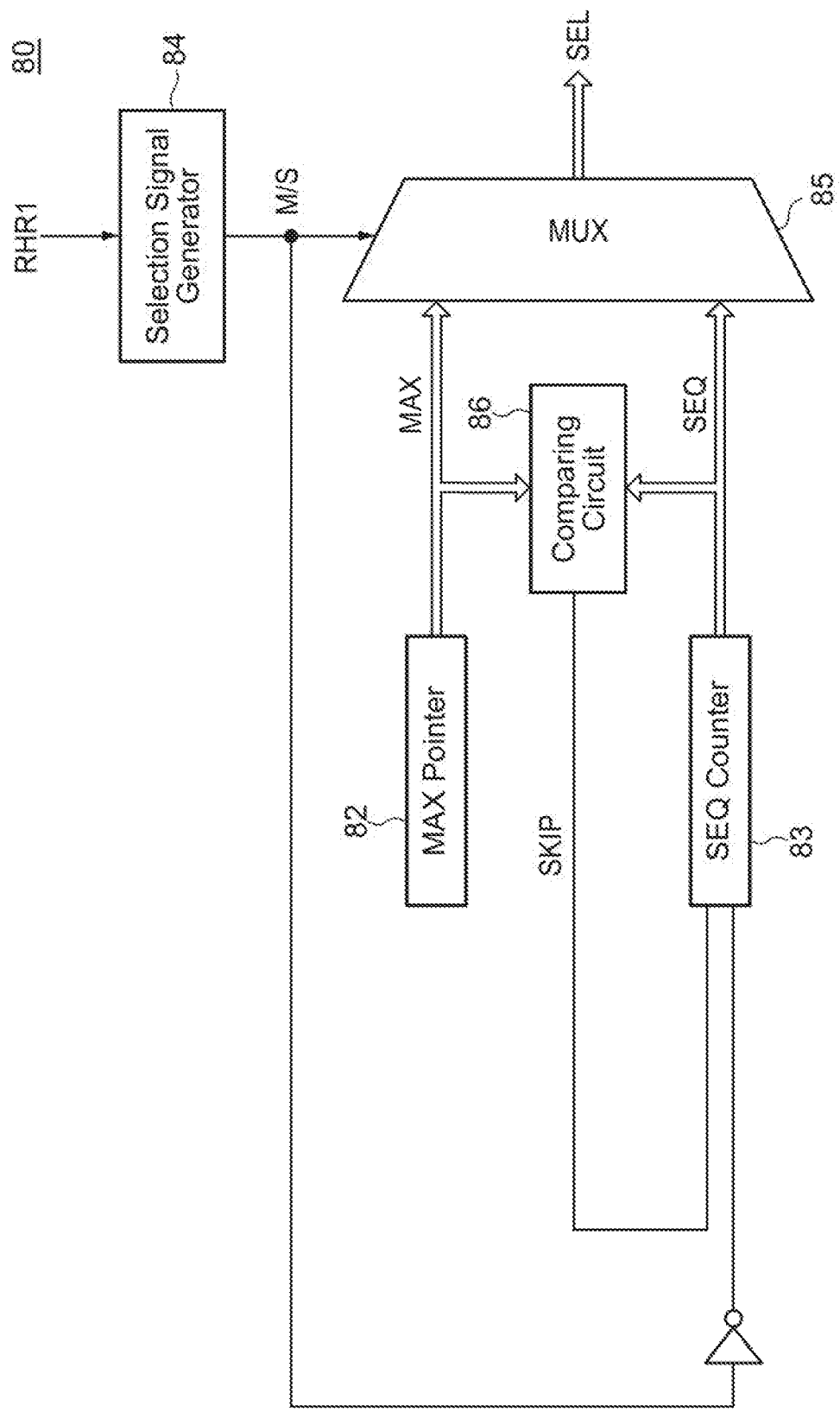
FIG. 5 is a block diagram for explaining a configuration of a control circuit.

As shown in FIG. 5, the control circuit 80 further includes a selection signal generator 84, a multiplexer 85, and a comparing circuit 86. The selection signal generator 84 generates a selection signal M/S having a value inverted each time the refresh selection signal RHR1 is activated twice. The selection signal M/S is supplied to the multiplexer 85. The multiplexer 85 selects the point value MAX output from the maximum pointer 82 when the selection signal M/S has one logical level (a low level, for example), and selects the point value SEQ output from the sequential counter 83 when the selection signal M/S has the other logical level (a high level, for example). The point value MAX or SEQ selected by the multiplexer 85 is output as the point value SEL. The point value SEL is used to select one of the address registers 50 to 57.

The point value MAX and the point value SEQ are compared with each other by the comparing circuit 86. When the point value MAX and the point value SEQ match with each other the comparing circuit 86 activates a skip signal SKIP The sequential counter 83 performs a count-up operation in response to the skip signal SKIP and the selection signal M/S.

Figure 6:
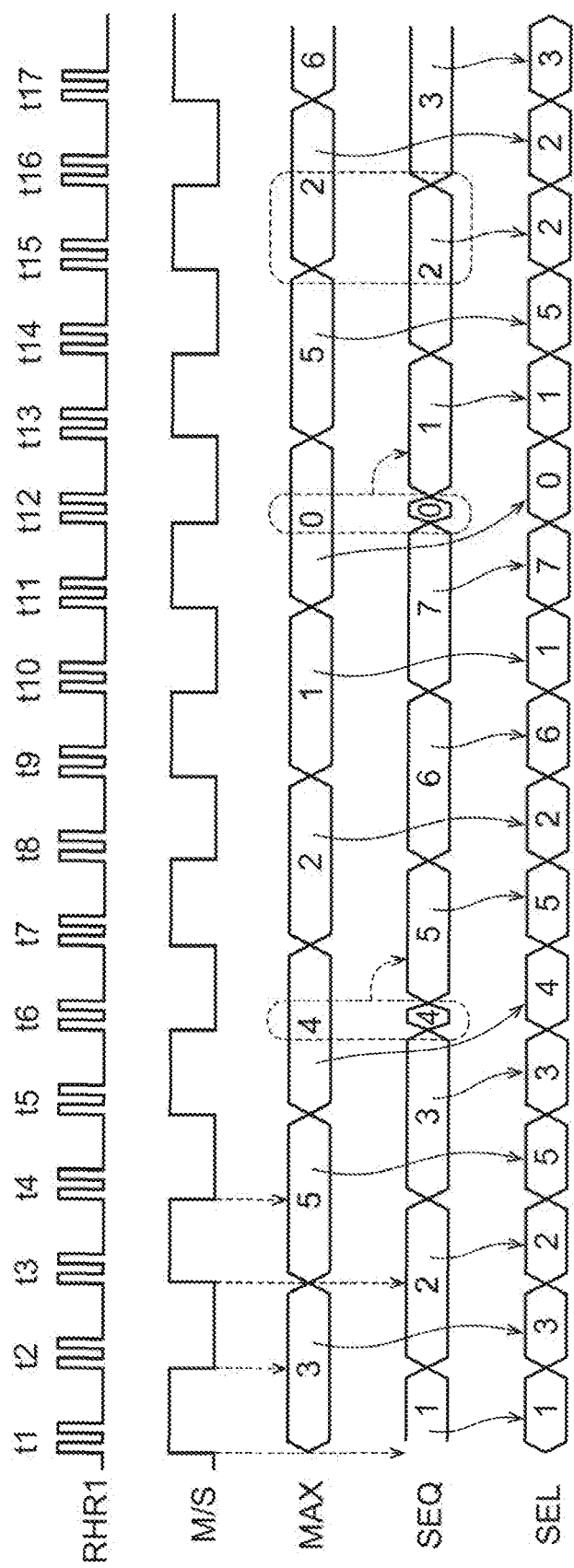
FIG. 6 is a timing chart for explaining an operation of the control circuit.

FIG. 6 is a timing chart for explaining an operation of the control circuit 80.

In the example shown in FIG. 6, the refresh selection signal RHR1 is activated twice at each of times t1 to t17. When the refresh selection signal RHR1 is activated twice, the selection signal M/S is inverted. Therefore, the multiplexer 85 alternately selects the point value MAX and the point value SEQ. In the example shown in FIG. 6, the point value MAX is selected when the selection signal M/S is at a low level and the point value SEQ is selected when the selection signal M/S is at a high level. Accordingly, the point value SEQ is selected at the times t1, t3, t5, t7, t9, t11, t13, t15, and t17, and the point value MAX is selected at the times t2, t4, t6, t8, t10, t12, t14, and t16. The point value SEQ is incremented in response to a falling edge of the selection signal M/S. The point value SEQ is, for example, a 3-bit signal and is incremented from 0 to 7 and then returns to 0. The point value MAX is also, for example, a 3-bit signal and indicates the address of one of the counter circuits 60 to 67 currently having a greatest count value.

When the point value MAX and the point value SEQ match with each other, the comparing circuit 86 activates the skip signal SKIP. In the example shown in FIG. 6, the point value MAX and the point value SEQ both indicate a value "4" at the time t6. Because a count signal UP is activated in response thereto, the point value SEQ indicated by the sequential counter 83 is immediately incremented to "5". As a result, the point value SEL generated when the refresh selection signal RHR1 is activated next time indicates a value "5" and "4", which is the value of the point value SEL generated in response to the previous point value MAX, is not repeatedly output. Similarly, the point value MAX and the point value SEQ both indicate a value "0" at the time t12. The count signal UP is activated in response thereto and accordingly the point value SEQ indicated by the sequential counter 83 is immediately incremented to "1". As a result, the point value SEL generated when the refresh selection signal RHR1 is activated next time indicates a value "1" and "0", which is the value of the point value SEL generated in response to the previous point value MAX, is not repeatedly output. In this way, according to the present embodiment, the value of the point value SEL generated in response to the previous point value MAX and the value of the point value SEL generated in response to the current point value SEQ do not match with each other Therefore, any unnecessary row hammer refresh operation can be avoided.

Meanwhile, even when the point value MAX and the point value SEQ match with each other, the point value SEQ of the sequential counter 83 is not skipped if the point value MAX is selected next. For example, although the point value MAX and the point value SEQ both indicate a value "2" at the time t15, the count signal UP is not activated because the selection signal M/S is at a high level at this timing That is, the point value SEQ is kept at the value "2" and any unnecessary skip operation is not performed.

As explained above, in the present embodiment, the point value SEQ is skipped when the point value MAX and the point value SEQ match with each other. Therefore, the value of the point value SEL generated in response to the previous point value MAX and the value of the point value SEL generated in response to the current point value SEQ do not match with each other and any unnecessary row hammer refresh operation can be avoided.

Figure 7A:
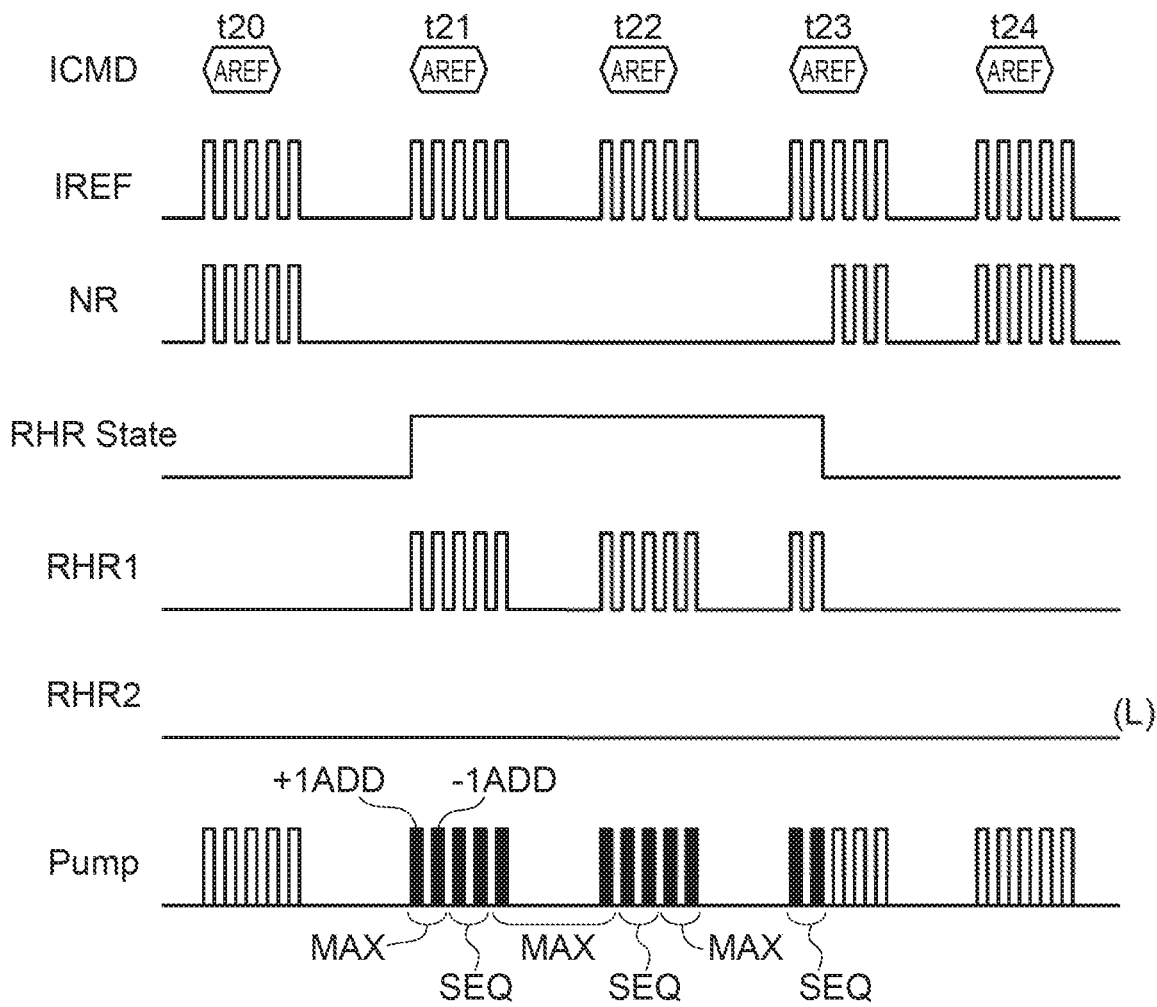
FIGS. 7A and 7B are timing charts respectively showing an example where a plurality of refresh operations are performed in response to one refresh command.
Figure 7B:
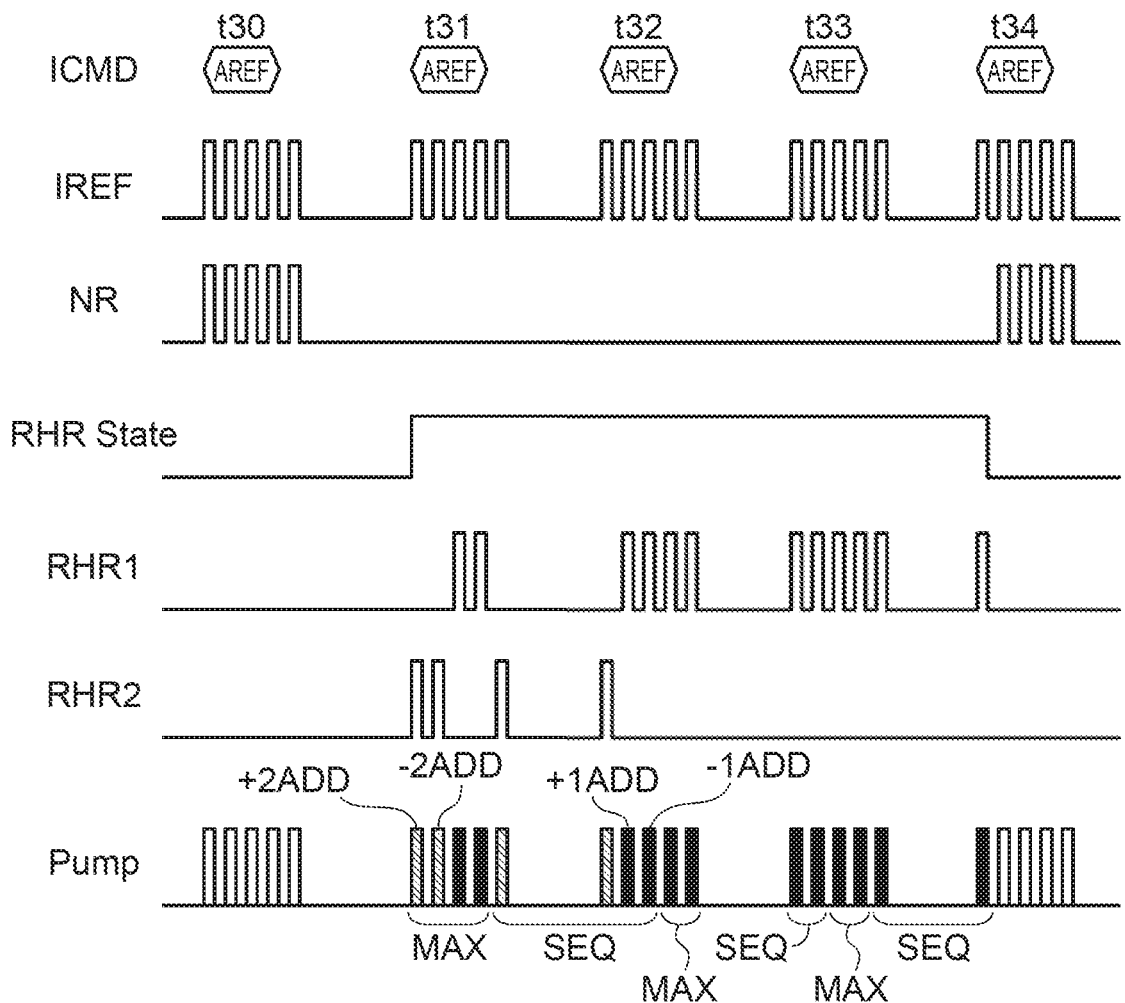

In the present embodiment, the refresh operation may be performed plural times in the semiconductor device 10 in response to one refresh command issued from outside. In FIGS. 7A and 7B, examples where the refresh operation is performed five times each time the refresh signal AREF is activated once are shown. In the example shown in FIG. 7A, the refresh signal AREF is activated at each of times t20 to t24 and the internal refresh signal IREF is activated five times in a row each time the refresh signal AREF is activated. Because the refresh state signal RHR State is in an inactive state at the time t20, the refresh selection signal NR is activated synchronously with the internal refresh signal IREF. In this case, the refresh operation is performed sequentially on five normal refresh addresses NRADD in response to the refresh signal AREF. At the time t21, the refresh state signal RHR State is an active state. In the example shown in FIG. 7A, the refresh selection signal RHR1 is also activated synchronously with the internal refresh signal IREF during a period when the refresh state signal RHR State is activated. In the example shown in FIG. 7A, the refresh operation is performed on 12 row hammer refresh addresses +1 ADD, −1ADD in one row hammer refresh operation. In this case, the refresh operation cannot be performed on 12 addresses in response to one refresh signal AREF. Therefore, the refresh state signal RHR State is kept in the active state until the row hammer refresh operation to the 12 addresses is completed. That is, five row hammer refresh operations are performed in response to each of the refresh signals AREF activated at the time 121 and the time t22, and two row hammer refresh operations are performed in response to the refresh signal AREF activated at the time t23.

In the example shown in FIG. 7A, first and second row hammer refresh operations are respectively performed on +1ADD and −1ADD of the row address VADD indicated by the point value MAX. Third and fourth row hammer refresh operations are respectively performed on +1ADD and −1ADD of the row address VADD indicated by the point value SEQ. Fifth and sixth row hammer refresh operations are respectively performed on +1ADD and −1ADD of the row address VADD indicated by the point value MAX. Seventh and eighth row hammer refresh operations are respectively performed on +1ADD and −1ADD of the row address VADD indicated by the point value SEQ. Ninth and tenth row hammer refresh operations are respectively performed on +1ADD and −1ADD of the row address VADD indicated by the point value MAX. Eleventh and twelfth row hammer refresh operations are respectively performed on +1ADD and −1ADD of the row address VADD indicated by the point value SEQ. In this way, each time the refresh selection signal RHR1 is activated twice, the row hammer refresh operation corresponding to the point value MAX and the row hammer refresh operation corresponding to the point value SEQ are alternately performed.

In the example shown in FIG. 7B, the refresh signal AREF is activated at each of times t30 to t34. At the time t30, because the refresh state signal RHR State signal is in an inactive state, the refresh selection signal NR is activated. In this case, the refresh operation is performed sequentially on five normal refresh addresses NRADD synchronously with the internal refresh signal IREF. At the time t31, the refresh state signal RHR State switches to an active state. In the example shown in FIG. 7B, during a period when the refresh state signal RHR State is activated, the refresh selection signal RHR1 or RHR2 is activated. In the example shown in FIG. 7B, the refresh operation is performed on 12 row hammer refresh addresses +1ADD, −1ADD and the refresh operation is performed to four row hammer refresh addresses +2ADD, −2ADD in one row hammer refresh operation. In this case, because the refresh operation cannot be performed on 16 addresses in response to one refresh signal AREF, the refresh state signal RHR State is kept in the active state until the row hammer refresh operation to the 16 addresses is completed. That is, five row hammer refresh operations are performed in response to each of the refresh signals AREF activated at the time t31, the time 132, and the time 133 and one row hammer refresh operation is performed in response to the refresh signal AREF activated at the time t34. In response to the refresh signal AREF activated at the time t31, the refresh operation is performed on two row hammer refresh addresses +1ADD, −1ADD and the refresh operation is performed on three row hammer refresh addresses +2ADD, −2ADD. In response to the refresh signal AREF activated at the time t32, the refresh operation is performed on four row hammer refresh addresses +1ADD, −1ADD and the refresh operation is performed on one row hammer refresh address +2ADD, −2ADD.

In the example shown in FIG. 7B, first to fourth row hammer refresh operations are respectively performed on +2ADD, −2ADD, +1ADD, and −1ADD of the row address VADD indicated by the point value MAX. Fifth to eighth row hammer refresh operations are respectively performed on +2ADD, −2ADD, +1ADD, and −1ADD of the row address VADD indicated by the point value SEQ. Ninth and tenth row hammer refresh operations are respectively performed on +1 ADD and −1ADD of the row address VADD indicated by the point value MAX. Eleventh and twelfth row hammer refresh operations are respectively performed on +1ADD and −1ADD of the row address VADD indicated by the point value SEQ. Thirteenth and fourteenth row hammer refresh operations are respectively performed on +1ADD and −1ADD of the row address VADD indicated by the point value MAX. Fifteenth and sixteenth row hammer refresh operations are respectively performed on +1ADD and −1ADD of the row address VADD indicated by the point value SEQ.

The sequential counter 83 does not need to be a counter circuit that simply increments the point value SEQ, and can be a linear feedback shift register (LFSR) circuit that generates a pseudorandom number.

Figure 8:
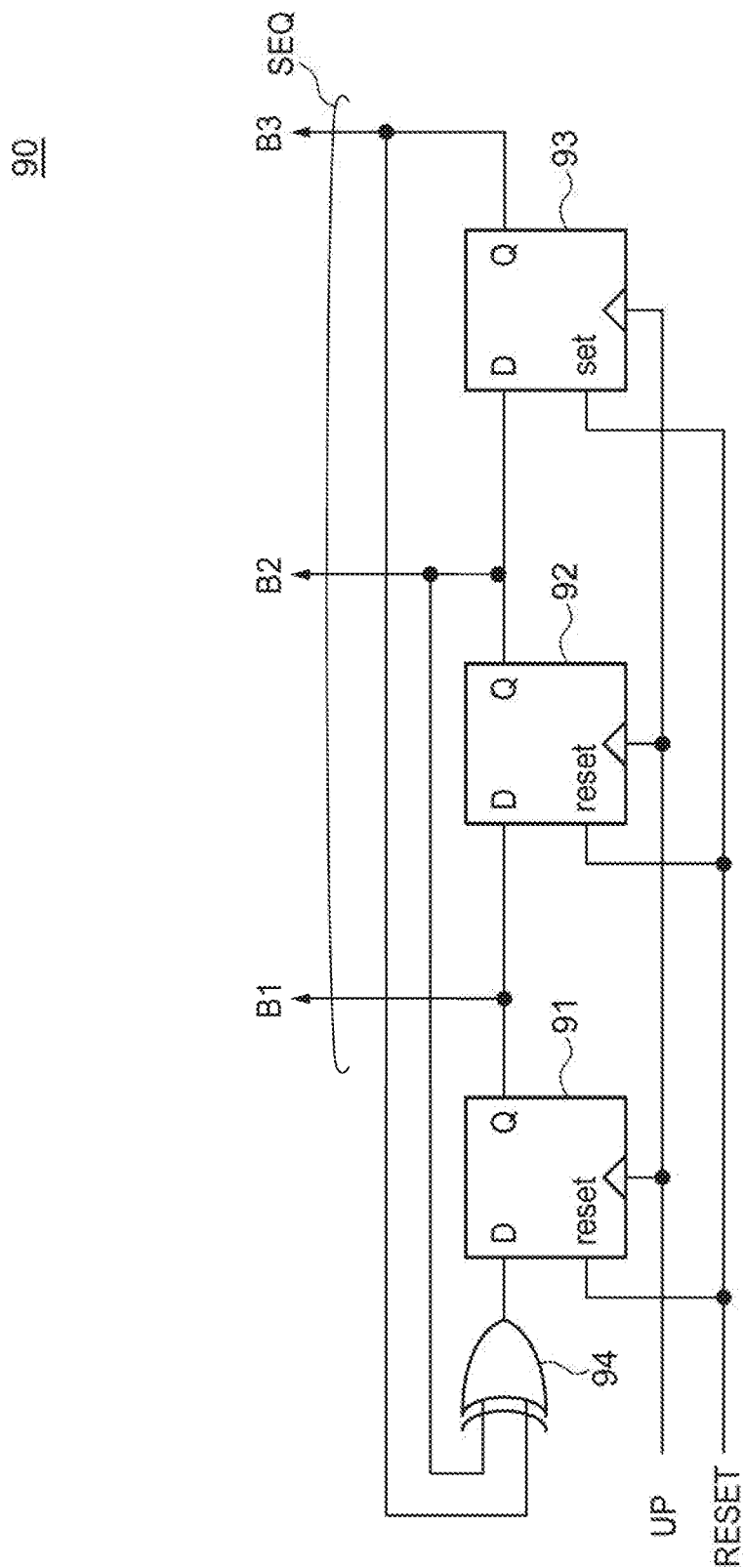
FIG. 8 is an example of a circuit diagram of an LFSR circuit.

FIG. 8 is an example of a circuit diagram of an LFSR circuit 90. In the example shown in FIG. 8, the LFSR circuit 90 includes a shift register constituted by three flip-flop circuits 91 to 93, and an EXOR circuit 94. The flip-flop circuits 91 to 93 are cascade-connected and respective output bits B1 to B3 constitute the point value SEQ being a pseudorandom number. The bit B2 and the bit B3 are input to the EXOR circuit 94 and an output thereof is fed back to the flip-flop circuit 91 at the first stage. The count signal UP is supplied in common to clock nodes of the flip-flop circuits 91 to 93. A reset signal RESET is supplied in common to reset or set nodes of the flip-flop circuits 91 to 93. Accordingly, when the reset signal RESET is activated, the value of the point value SEQ is initialized to 4. When the count value UP is activated, the value of the point value SEQ is sequentially updated.

Although this invention has been disclosed in the context of certain preferred embodiments and examples, it will be understood by those skilled in the an that the inventions extend beyond the specifically disclosed embodiments to other alternative embodiments and/or uses of the inventions and obvious modifications and equivalents thereof. In addition, other modifications which are within the scope of this invention will be readily app rent to those of skill in the an based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying modes of the disclosed invention. Thus, it is intended that the scope of at least some of the present invention herein disclosed should not be limited by the particular disclosed embodiments described above.

The invention claimed is:

1. An apparatus comprising:
a plurality of address registers each configured to store an address signal, wherein the address signal is associated with an activation command;
a plurality of counter circuits each configured to store a count value corresponding to an associated one of the address registers, wherein the count value corresponds to a number of times the address signal associated with the activation command is detected;
a first circuit configured to cyclically select one of the address registers in response to a first signal, wherein the first circuit includes a linear feedback shift register circuit that selects one of the address registers, wherein a count value of the linear feedback shift register circuit is updated in response to the first signal;
a second circuit configured to select one of the address registers based on a count value of each of the counter circuits; and
a third circuit configured to activate a second signal when the first and second circuits select a same one of the address registers.

2. The apparatus of claim 1, wherein the first circuit updates a selection of the address registers in response to the first and second signals.

3. The apparatus of claim 1, wherein the second circuit selecting one of the address registers that the count value corresponding thereto indicates a greatest value among the counter circuits.

4. The apparatus of claim 1, further comprising:
a fourth circuit comparing an input address with the address signal stored in each of the address registers; and
a fifth circuit updating the count value of a corresponding one of the address registers when the fourth circuit detects that the input address matches with one of the address signals.

5. The apparatus of claim 4, wherein the input address is overwritten in one of the address registers when the fourth circuit detects that the input address does not match with any of the address signals.

6. The apparatus of claim 5, wherein the input address is overwritten in one of the address registers that the count value corresponding thereto indicates a smallest value among the counter circuits.

7. The apparatus of claim 6, wherein the count value of the counter circuit corresponding to the address register storing the input address is reset to an initial value.

8. The apparatus of claim 1, wherein the first and second circuits alternately select one of the address registers.

9. The apparatus of claim 1, further comprising an address convertor that generates a refresh address based on the address signal stored in a selected one of the address registers by the first or second circuit.

10. The apparatus of claim 1, wherein the count value corresponding to the selected one of the address registers is reset to an initial value.

11. The apparatus of claim 1,
wherein the first circuit includes another counter circuit that selects one of the address registers, and
wherein a count value of the another counter circuit is updated in response to the first signal.

12. An apparatus comprising:
a plurality of address registers each configured to store an address signal;
a plurality of counter circuits each configured to store a count value corresponding to an associated one of the address registers;
a first circuit configured to cyclically select one of the address registers in response to a first signal;
a second circuit configured to select one of the address registers based on a count value of each of the counter circuits; and
a third circuit configured to activate a second signal when the first and second circuits select a same one of the address registers;
wherein the first circuit includes a linear feedback shift register circuit that selects one of the address registers, and
wherein a count value of the linear feedback shift register circuit is updated in response to the first signal.

13. An apparatus comprising:
a plurality of address registers, each configured to store an address signal associated with an access;
a plurality of counter circuits provided correspondingly to the plurality of address registers, each of the plurality of counter circuits being configured to update a count value in response to detecting the access to the address signal stored in an associated one of the plurality of address registers;
a first circuit configured to select one of the plurality of address registers based on the count values of the plurality of counter circuits;
a second circuit configured to select one of the plurality of address registers irrespective of the count values of the plurality of counter circuits, wherein the second circuit includes a linear feedback shift register circuit that selects one of the plurality of address registers; and
a third circuit configured to activate a skip signal when the same one of the plurality of address registers is consecutively selected by the first circuit and the second circuit.

14. The apparatus of claim 13, wherein the second circuit is configured to cyclically select one of the plurality of address registers.

15. The apparatus of claim 13, wherein the first circuit is configured to select one of the address registers that the count value corresponding thereto indicates a greatest value among the counter circuits.

16. The apparatus of claim 13, wherein the first and second circuits are configured to alternately select one of the address registers.

17. The apparatus of claim 13, wherein the count value corresponding to the selected one of the address registers is reset to an initial value.

18. The apparatus of claim 13, wherein a count value of the linear feedback shift register circuit is updated in response to a first signal.

19. The apparatus of claim 18, wherein the second circuit is configured to select the one of the plurality of address registers responsive to the first signal.

* * * * *